US011082006B2

(12) United States Patent
Kumar et al.

(10) Patent No.: US 11,082,006 B2
(45) Date of Patent: Aug. 3, 2021

(54) LOW POWER CRYSTAL OSCILLATOR

(71) Applicant: STMicroelectronics International N.V., Schiphol (NL)

(72) Inventors: Anand Kumar, Noida (IN); Nitin Jain, Ghaziabad (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 16/703,250

(22) Filed: Dec. 4, 2019

(65) Prior Publication Data
US 2020/0235702 A1 Jul. 23, 2020

Related U.S. Application Data

(60) Provisional application No. 62/795,784, filed on Jan. 23, 2019.

(51) Int. Cl.
*H03B 5/36* (2006.01)
*H03B 5/06* (2006.01)

(52) U.S. Cl.
CPC .............. *H03B 5/364* (2013.01); *H03B 5/06* (2013.01); *H03B 2200/0012* (2013.01); *H03B 2200/0038* (2013.01)

(58) Field of Classification Search
CPC .. H03B 5/364; H03B 5/06; H03B 2200/0012; H03B 2200/0038
See application file for complete search history.

(56) References Cited

U.S. PATENT DOCUMENTS

| 7,123,113 | B1 * | 10/2006 | Brennan | ................... | H03L 5/00 |
| | | | | | 331/158 |
| 9,461,584 | B2 | 10/2016 | Mittal et al. | | |
| 2012/0068774 | A1 | 3/2012 | Chen et al. | | |
| 2014/0091869 | A1 | 4/2014 | Tham | | |
| 2015/0214894 | A1 * | 7/2015 | Calhoun | .................. | H03B 5/04 |
| | | | | | 331/115 |
| 2017/0033740 | A1 | 2/2017 | Calhoun et al. | | |
| 2018/0006605 | A1 | 1/2018 | Kumar et al. | | |

FOREIGN PATENT DOCUMENTS

JP 2012235208 A 11/2012

OTHER PUBLICATIONS

Shrivastava, Aatmesh, et al: "A 1.5 nW, 32.768 kHz XTAL Oscillator Operational From a 0.3 V Supply," IEEE Journal of Solid-State Circuits, 2015 (12 pages).

* cited by examiner

*Primary Examiner* — Jeffrey M Shin
(74) *Attorney, Agent, or Firm* — Crowe & Dunlevy

(57) ABSTRACT

A clock signal is generated with an oscillator. A crystal oscillator core within the oscillator circuit is switched on to produce first and second oscillation signals that are approximately opposite in phase. When a difference between a voltage of the first oscillation signal and a voltage of the second oscillation signal exceeds an upper threshold range, the crystal oscillator core is switched off. When the difference between the voltage of the first oscillation signal and the voltage of the second oscillation signal falls below the upper threshold range, the crystal oscillator core is switched back on. This operation is repeated so as to produce the clock signal.

23 Claims, 11 Drawing Sheets

LOW POWER CRYSTAL OSCILLATOR

RELATED APPLICATION

This application claims priority to U.S. Provisional Patent Application No. 62/795,784, filed Jan. 23, 2019, the contents of which are incorporated by reference.

TECHNICAL FIELD

This application is directed to the field of oscillator circuits, and in particular, to a crystal oscillator circuit that achieves low power consumption while being realized without excess area consumption.

BACKGROUND

A Pierce oscillator is a type of electronic oscillator commonly used in piezoelectric crystal oscillator circuits. A known Pierce oscillator 5 is shown in FIG. 1, and includes a piezoelectric crystal 6, capacitors C1 and C2, a resistor R, and an inverter 7.

The piezoelectric crystal 6 has a crystal input XTALIN and a crystal output XTALOUT. The capacitor C1 is connected between the crystal input XTALIN and ground, and the capacitor C2 is connected between the crystal output XTALOUT and ground. The resistor R is connected between the crystal input XTALIN and the crystal output XTALOUT. In addition, the inverter 7 has its input coupled to the crystal input XTALIN and its output coupled to the crystal output XTALOUT.

The resistor R1 acts as a feedback resistor, biasing the inverter 7 in its linear region of operation and effectively causing it to function as a high-gain inverting amplifier. The resistor R1 and capacitors C1 and C2 provide the necessary load impedance.

While this Pierce oscillator provides a precise output frequency as well as stability across process, voltage and temperature (PVT), oscillators are often needed in battery powered electronic devices. As can be appreciated, lowering power consumption is of desire in battery powered electronic devices.

It is known to perform duty cycling on an oscillator, such as a Pierce oscillator, so as to keep the amplitude of voltage and current of the produced oscillating signal within desired bounds, thereby lowering power consumption. However, techniques for performing such duty cycling typically involve the generation of external reference voltages for use in determining whether the amplitude of the oscillation voltage is within desired bounds. This solution brings with it an undesirable amount of area consumption for not only the generation of the external reference voltages, but also for the circuits that utilize such external references to perform the duty cycling.

Therefore, development is still needed, so that duty cycling can be performed to reduce power consumption, but without the excess area consumption of conventional designs.

SUMMARY

Disclosed herein is a crystal oscillator circuit including a crystal producing first and second oscillation signals that are approximately opposite in phase, and a monitor circuit. The monitor circuit is configured to switch off power to the crystal oscillator core in response to a difference between a voltage of the first oscillation signal and a voltage of the second oscillation signal exceeding an upper threshold range, and to switch on power to the crystal oscillator core in response to the difference between the voltage of the first oscillation signal and the voltage of the second oscillation signal falling below the upper threshold range.

The monitor circuit may include a first comparator configured to indicate whether the difference between the voltage of the first oscillation signal and the voltage of the second oscillation signal exceeds the upper threshold range by pulsing its output when the difference between the voltage of the first oscillation signal and the voltage of the second oscillation signal exceeds the upper threshold range.

A second comparator may be configured to indicate whether a difference between the voltage of the first oscillation signal and the voltage of the second oscillation signal exceeds a lower threshold range less than the upper threshold range by pulsing its output when the difference between the voltage of the first oscillation signal and the voltage of the second oscillation signal exceeds the lower threshold range The monitor circuit may output a clock signal as a function of the first and second oscillation signals.

The crystal may respectively produce the first and second oscillation signals at first and second terminals. A transistor may have a first conduction terminal connected to the second terminal of the crystal, a second conduction terminal connected to a reference voltage, and a control terminal connected to the first terminal of the crystal. A current source may be connected to the first conduction terminal of the transistor. A feedback resistor may be connected between the first conduction terminal of the transistor and the control terminal of the transistor. A first capacitor may be connected between the first terminal of the crystal and the reference voltage, and a second capacitor may be connected between the second terminal of the crystal and the reference voltage.

The monitor circuit may generate a control signal that serves to turn the current source off in response to the difference between the voltage of the first oscillation signal and the voltage of the second oscillation signal exceeding the upper threshold range and that serves to turn the current source on in response to the difference between the voltage of the first oscillation signal and the voltage of the second oscillation signal falling back below the upper threshold range.

In some instances, the monitor circuit only compares the voltage of the first oscillation signal to the voltage of the second oscillation signal, does not compare the voltage of the first oscillation signal to a reference voltage, and does not compare the voltage of the second oscillation signal to the reference voltage.

A method aspect disclosed herein is a method of generating a clock signal. The method includes steps of: a) switching on a crystal oscillator core to produce first and second oscillation signals that are approximately opposite in phase; b) when a difference between a voltage of the first oscillation signal and a voltage of the second oscillation signal exceeds an upper threshold range, switching off the crystal oscillator core; c) when the difference between the voltage of the first oscillation signal and the voltage of the second oscillation signal falls below the upper threshold range, switching on the crystal oscillator core; and d) repeating steps b) and c) to produce the clock signal.

This method may include outputting the clock signal from a buffer that determines the difference between the voltage of the first oscillation signal and the voltage of the second oscillation signal.

Also disclosed herein is a variant of the crystal oscillator circuit including a crystal producing a first oscillation signal, and a monitor circuit configured to switch off power to the crystal oscillator core in response to a voltage of the first oscillation signal exceeding an upper threshold range without comparison of the voltage of the first oscillation signal to a reference voltage generated externally to the monitor circuit, and to switch on power to the crystal oscillator core in response to the voltage of the first oscillation signal falling below the upper threshold range without comparison of the voltage of the first oscillation signal to a reference voltage generated externally to the monitor circuit.

The monitor circuit may include a first common source amplifier having a first NMOS transistor with a source coupled to ground, a drain receiving a first reference current and providing output, and a gate coupled to receive the first oscillation signal.

The monitor circuit may also include a second common source amplifier having a second NMOS transistor with a source coupled to ground, a drain receiving a second reference current greater than the first reference current and providing output, and a gate coupled to receive the first oscillation signal.

The monitor circuit may include a first NMOS transistor having a source coupled to ground, a drain receiving a first reference current and providing output, and a gate coupled to receive the first oscillation signal, a first PMOS transistor having a source coupled to a source voltage, a drain coupled to the drain of the first NMOS transistor, and a gate, and a first inverter having an input coupled to the drain of the first NMOS transistor and an output coupled to the drain of the first PMOS transistor.

The monitor circuit may also include a second NMOS transistor having a source coupled to ground, a drain receiving a second reference current and providing output, and a gate coupled to receive the first oscillation signal, a second PMOS transistor having a source coupled to a source voltage, a drain coupled to the drain of the second NMOS transistor, and a gate, and a second inverter having an input coupled to the drain of the second NMOS transistor and an output coupled to the drain of the second PMOS transistor. A size of the first PMOS transistor may be less than a size of the second PMOS transistor.

The crystal may produce the first oscillation signal at a first terminal. The crystal oscillator circuit may include a transistor having a first conduction terminal connected to a second terminal of the crystal, a second conduction terminal connected to a reference voltage, and a control terminal connected to the first terminal of the crystal, a current source connected to the first conduction terminal of the transistor, a feedback resistor connected between the first conduction terminal of the transistor and the control terminal of the transistor, a first capacitor connected between the first terminal of the crystal and the reference voltage, and a second capacitor connected between the second terminal of the crystal and the reference voltage.

Also disclosed herein is another method of generating a clock signal. This method may include steps of: a) switching on a crystal oscillator core to produce a first oscillation signal; b) generating an indication when a voltage of the first oscillation signal exceeds an upper threshold range without comparing the first oscillation signal to an externally generated reference voltage, and when the voltage of the first oscillation signal exceeds an upper threshold range, switching off the crystal oscillator core; c) generating an indication when the voltage of the first oscillation signal falls below the upper threshold range without comparing the first oscillation signal to an externally generated reference voltage, and when the voltage of the first oscillation signal falls below the upper threshold range, switching on the crystal oscillator core; and d) repeating steps b) and c) to produce the clock signal.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
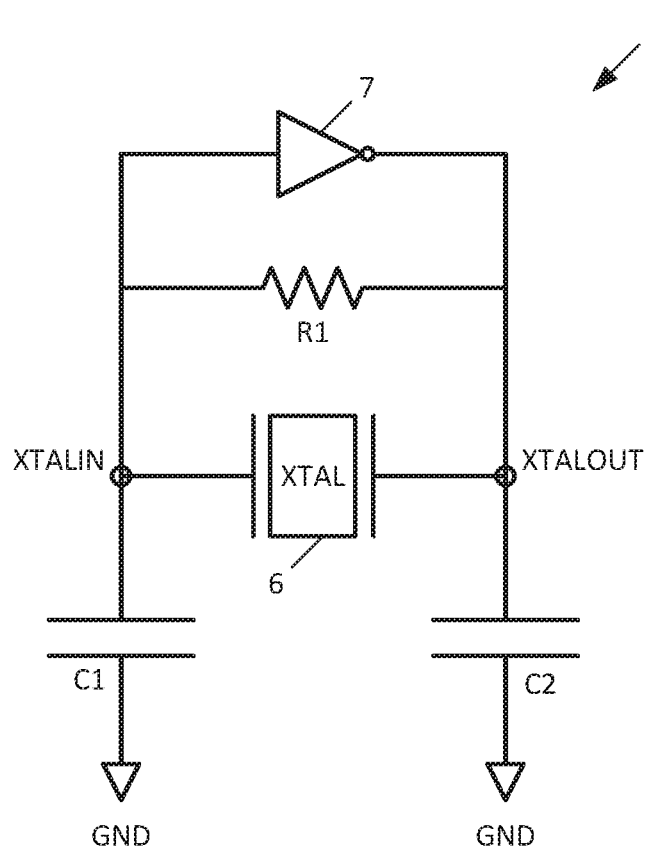
FIG. 1 is a schematic diagram of a prior art Pierce oscillator circuit.
Figure 2A:
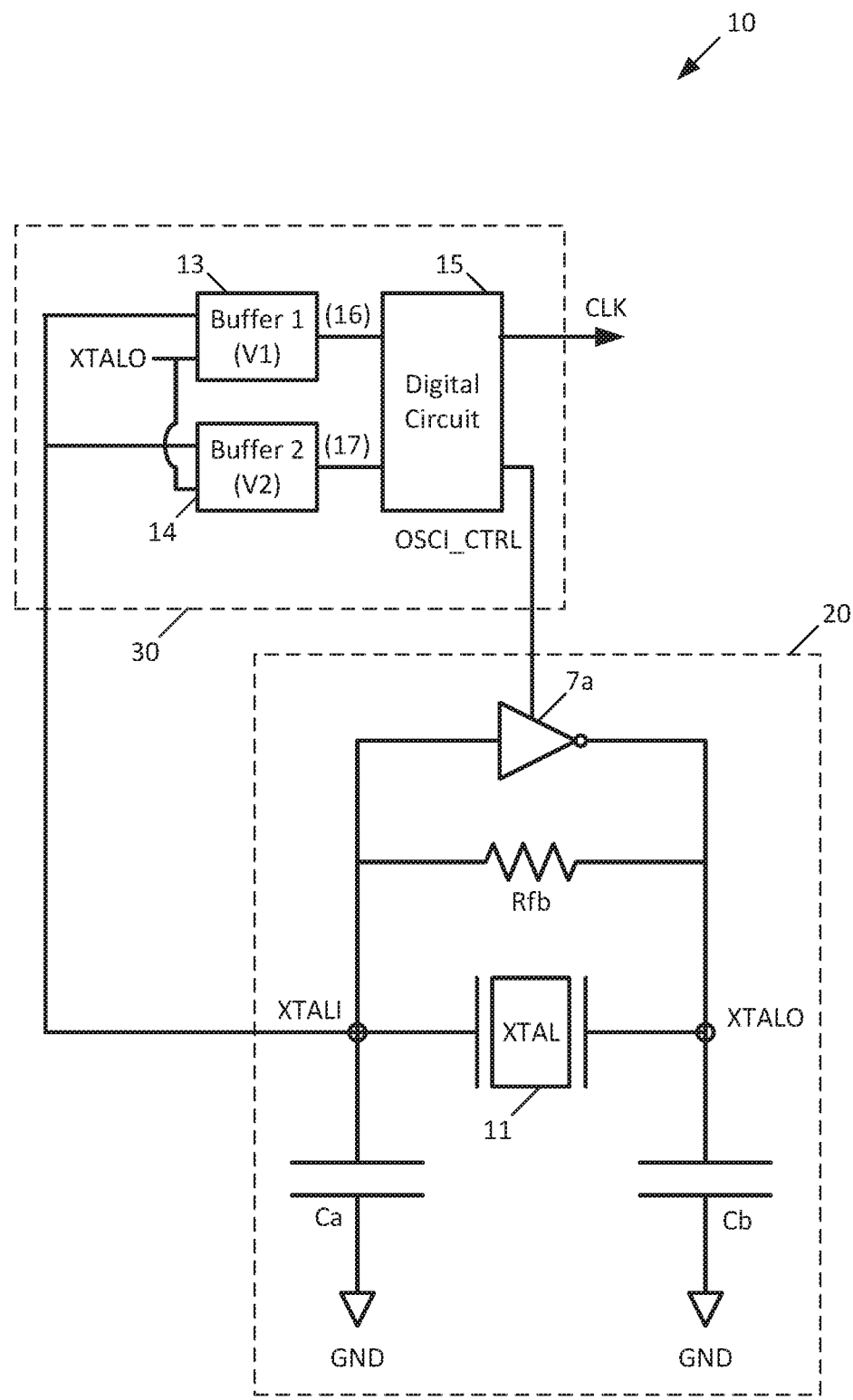
FIG. 2A is a schematic block diagram of a crystal oscillator circuit disclosed herein.

Described with reference to FIG. 2A is a crystal oscillator circuit 10 that includes an oscillator circuit 20 and a monitor circuit 30. The oscillator circuit 20 can be considered to be a Pierce oscillator, and includes a piezoelectric crystal 11, such as quartz, that has a crystal input XTALI and a crystal output XTALO. A capacitor Ca is directly electrically connected between the crystal input XTALI and ground, and a capacitor Cb is directly electrically connected between the crystal output XTALO and ground. A feedback resistor Rfb is directly electrically connected between the crystal input XTALI and the crystal output XTALO. An inverter 7a has its input directly electrically connected to the crystal input XTALI and has its output directly electrically connected to the crystal output XTALO. The inverter 7a is turned on or off by the oscillator control signal OSCI_CTRL.

In general, the monitor circuit 30 serves to monitor the voltage difference between the crystal input XTALI and crystal output XTALO, and to switch the inverter 7a on and off at appropriate times so as to maintain the voltage difference within a desired range.

Greater details will now be given. The monitor circuit 30 includes a first buffer circuit 13 having differential inputs directly electrically connected to the crystal input XTALI and the crystal output XTALO and a second buffer circuit 14 also having differential inputs directly electrically connected to the crystal input XTALI and the crystal output XTALO. The first buffer circuit 13 is configured to compare the voltage at XTALI to the voltage at XTALO, and to provide an output 16 to a digital circuit 15 that indicates if the difference between the voltage at XTALI and the voltage at XTALO (referred to hereinafter as "the crystal voltage difference") is greater than a first threshold voltage V1.

The second buffer circuit 14 is also configured to compare the voltage at XTALI to the voltage at XTALO, and to provide an output 17 to the digital circuit 15 that indicates if the crystal voltage difference is greater than a second threshold voltage V2. The second threshold voltage V2 is greater than the first threshold voltage V1.

The digital circuit 15 generates an oscillator control signal OSCI_CTRL that serves to switch the inverter 7a on or off (thereby switching power to the crystal oscillator core of the piezoelectric crystal 11 on or off); this generation is performed as a function of the output 17 (which indicates if the crystal voltage difference is greater than V2). The digital circuit 15 also generates a clock signal CLK that serves as the output of the crystal oscillator circuit 10; this generation is performed as a function of the output 16 (which indicates if the crystal voltage difference is greater than V1), meaning that if the crystal voltage difference is less than V1, the clock signal CLK is not generated as output by the digital circuit 15, and if the crystal voltage difference is greater than V1, the clock signal CLK is generated as output by the digital circuit 15.

Operation will now be described with additional reference to FIG. 3. In operation, the signals at XTALI and XTALO (which will be referred to hereinafter simply as XTALI and XTALO as shorthand) oscillate in phase but with their voltage amplitudes being approximately opposite of one another. The traces labeled Trace1 and Trace2 in FIG. 3 do not represent signals, but represent the difference between the XTALI and XTALO signals at each given point in time for this embodiment of FIG. 2A, and for the other embodiments shown in FIGS. 2B-2C. For the embodiments of FIGS. 2D-2E, the traces labeled Trace1 and Trace2 represent absolute amplitude envelopes of the XTALI and XTALI signals superimposed on one another. The XTALI and XTALO signals are not specifically shown in FIG. 3 due to their high frequency.

Figure 3:
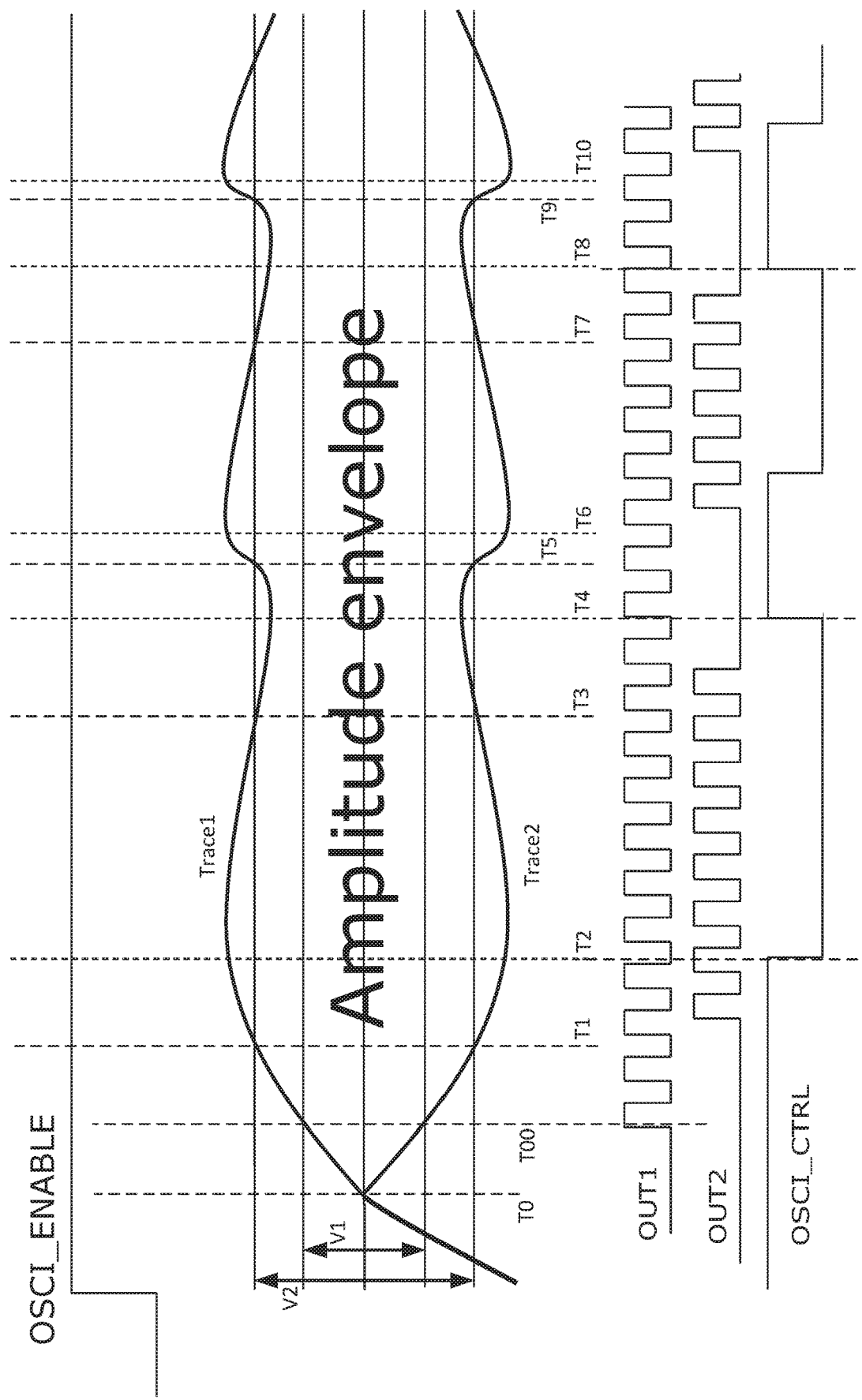
FIG. 3 is a graph showing operation of the crystal oscillator circuit of FIGS. 2A-2B.

Referring specifically to FIG. 2A and FIG. 3, at time T0, the crystal oscillator circuit 10 is turned on by asserting the oscillator control signal OSCI_Ctrl, and XTALI and XTALO begin to oscillate in voltage with increasing amplitudes until, at time TOO, difference in voltage between them (the crystal voltage difference) exceeds threshold voltage V1. At this point, the first buffer circuit 13 begins pulsing output 16 (shown as OUT1) indicating that the crystal voltage difference exceeds threshold voltage V1, and the digital circuit 15 then begins to output the clock signal CLK.

As XTALI and XTALO continue to oscillate in voltage with increasing amplitudes, at time T1, the crystal voltage difference exceeds threshold voltage V2. At this point, the second buffer circuit 14 begins pulsing output 17 (shown as OUT2) indicating that the crystal voltage difference exceeds threshold voltage V2, and the digital circuit 15 then deasserts the OSCI_CTRL signal at time T2. Since the OSCI_C-TRL signal functions as an enable signal or power switch for the inverter 7a, the result is that the inverter 7a shuts off at time T2.

As can be seen between times T2-T3, the result is that the oscillations of XTALI and XTALO begin to decay and thus the crystal voltage difference decays. At time T3, the crystal voltage difference has decayed sufficiently to fall below threshold V2. Therefore, shortly after this, the buffer circuit 14 ceases pulsing output 17 (shown as OUT2), indicating that the crystal voltage difference has fallen below voltage V2, and the digital circuit 15 reasserts the OSCI_CTRL signal at time T4.

As can be seen between times T4-T5, the result is that the magnitude of the oscillations of XTALI and XTALO begin to increase in amplitude, and thus the crystal voltage difference increases. At time T5, the crystal voltage difference exceeds threshold voltage V2. At this point, the second buffer circuit 14 produces begins pulsing output 17 (shown as OUT2) indicating that the crystal voltage difference exceeds threshold voltage V2, and the digital circuit 15 then once again deasserts the OSCI_CTRL signal at time T5. The result is that the inverter 7a shuts off at time T6, and the crystal voltage difference begins to decay again.

This cycle repeats, thus limiting the amplitude of XTALI and XTALO, in turn limiting the amplitude of the produced clock signal CLK.

Figure 2B:
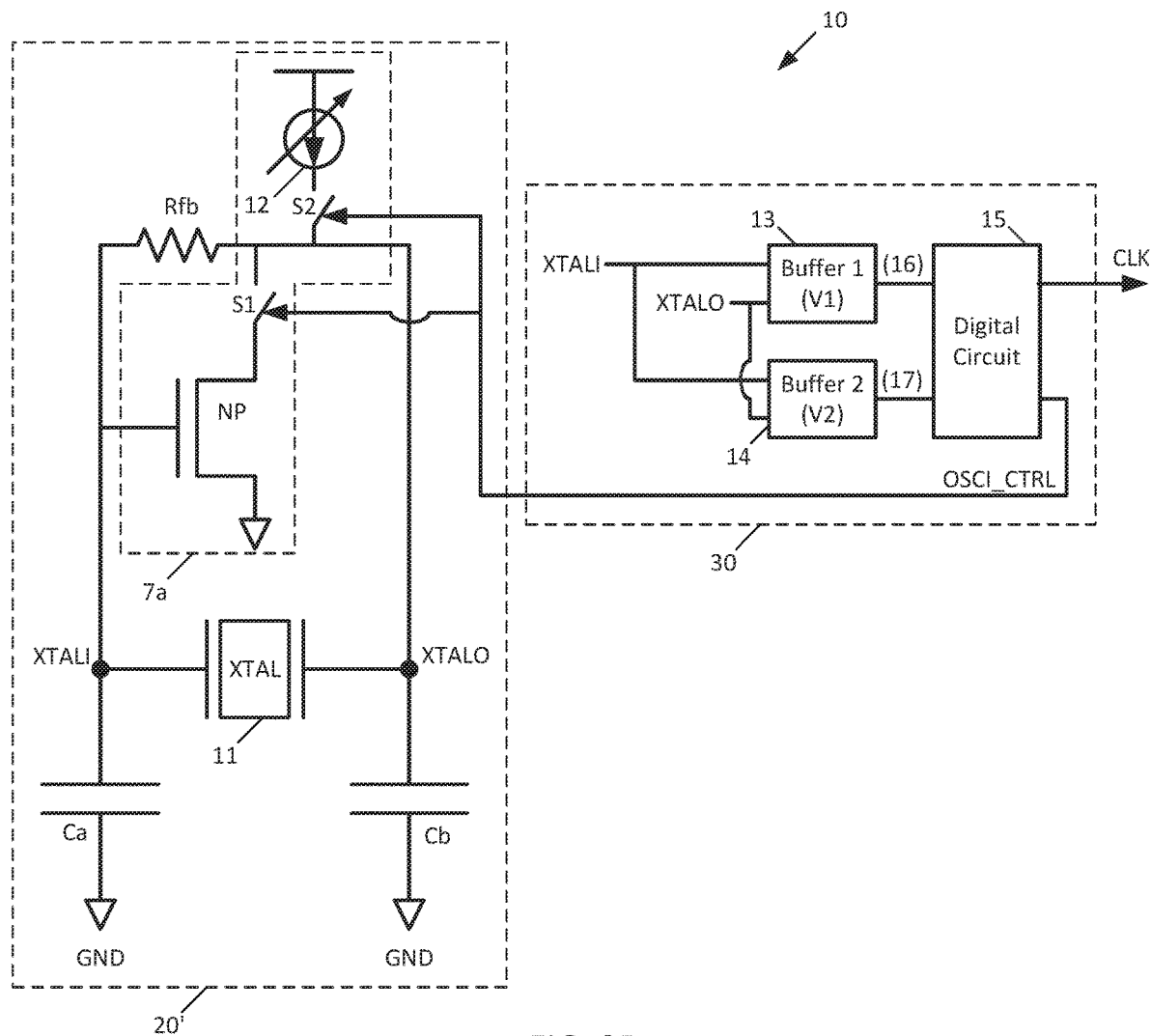
FIG. 2B is a schematic block diagram of an embodiment of a crystal oscillator circuit disclosed herein in which the buffers use differential sensing.

Another embodiment is now described with reference to FIG. 2B. Here, the monitor circuit 30 is the same as in FIG. 2A, but the structure of the oscillator circuit 20' is different. The oscillator circuit 20' includes a piezoelectric crystal 11, such as quartz, that has a crystal input XTALI and a crystal output XTALO. A capacitor Ca is directly electrically connected between the crystal input XTALI and ground, and a capacitor Cb is directly electrically connected between the crystal output XTALO and ground. A feedback resistor Rfb is directly electrically connected between the crystal input XTALI and the crystal output XTALO.

Here, the inverter 7a' is comprised of an NMOS transistor NP and a current source 12. The NMOS transistor NP has its source directly electrically connected to ground, its drain directly electrically connected to the crystal output XTALO via switch S1, and its gate directly electrically connected to the crystal input XTALI. The current source 12 is directly electrically connected via switch S2 between a supply voltage and the crystal output XTALO. Switches S1 and S2 are switched on and off by the oscillator control signal OSCI_CTRL.

Operation proceeds as described above. The buffer circuits 13 and 14 compare XTALI and XTALO to one another. If the difference in voltage between XTALI and XTALO is less than the threshold V2, the buffer circuit 14 indicates as such to the digital circuit 15 by failing to pulse the output 17, which in turn generates the oscillator control signal OSCI_CTRL to cause the current source 12 to switch on, resulting in the voltage difference between XTALI and XTALO (i.e. the crystal voltage difference) beginning to increase. When the crystal voltage difference rises sufficiently to exceed the threshold V2, then the buffer circuit 14 indicates as such to the digital circuit 15 by pulsing the output 17, which in turn generates the oscillator control signal OSCI_CTRL to cause the current source 12 to switch off. This is repeated, and provided that the crystal voltage difference exceeds the threshold V1 (which is less than the threshold V2), serves to cause the digital circuit 15 to generate the clock signal CLK for output.

Using the crystal oscillator circuit 10, the currents of XTALIN and XTALOUT are cut nearly in half as compared to those in a typical Pierce oscillator. This improvement is for a typical case; in some instances, the improvement may be even greater. For example, as the frequency of oscillation increases, the improvement grows.

It should be appreciated that due to the lack of external reference voltage generation circuits, the monitor circuit 30 adds minimal area to the crystal oscillator circuit 10 while still effectuating duty cycling to conserve power, making it particularly suitable for use in mobile devices. Duty cycling itself is particularly useful because it allows the provision of a sufficient negative resistance by the transistor NP to facilitate robust and reliable startup performance, yet without the high power consumption resulting from the current of the XTALI and XTALO signals when sufficient negative resistance is provided by the transistor NP.

The transconductance boosting techniques described in U.S. Pat. No. 9,461,584 (which is incorporated by reference) can be applied to the transistor NP to help further reduce power consumption. In fact, any transconductance boosting techniques can be applied to the transistor NP to help reduce power consumption.

In addition, those of skill in the art will understand that the crystal oscillator circuit 10 is adaptive to different load capacitances. Thus, the crystal oscillator circuit 10 can be designed for high load capacitances, and if a lower load capacitance is applied to a so-designed crystal oscillator circuit 10, said crystal oscillator circuit 10 will self-optimize to accommodate the lower current values associated with lower load capacitances.

Figure 2C:
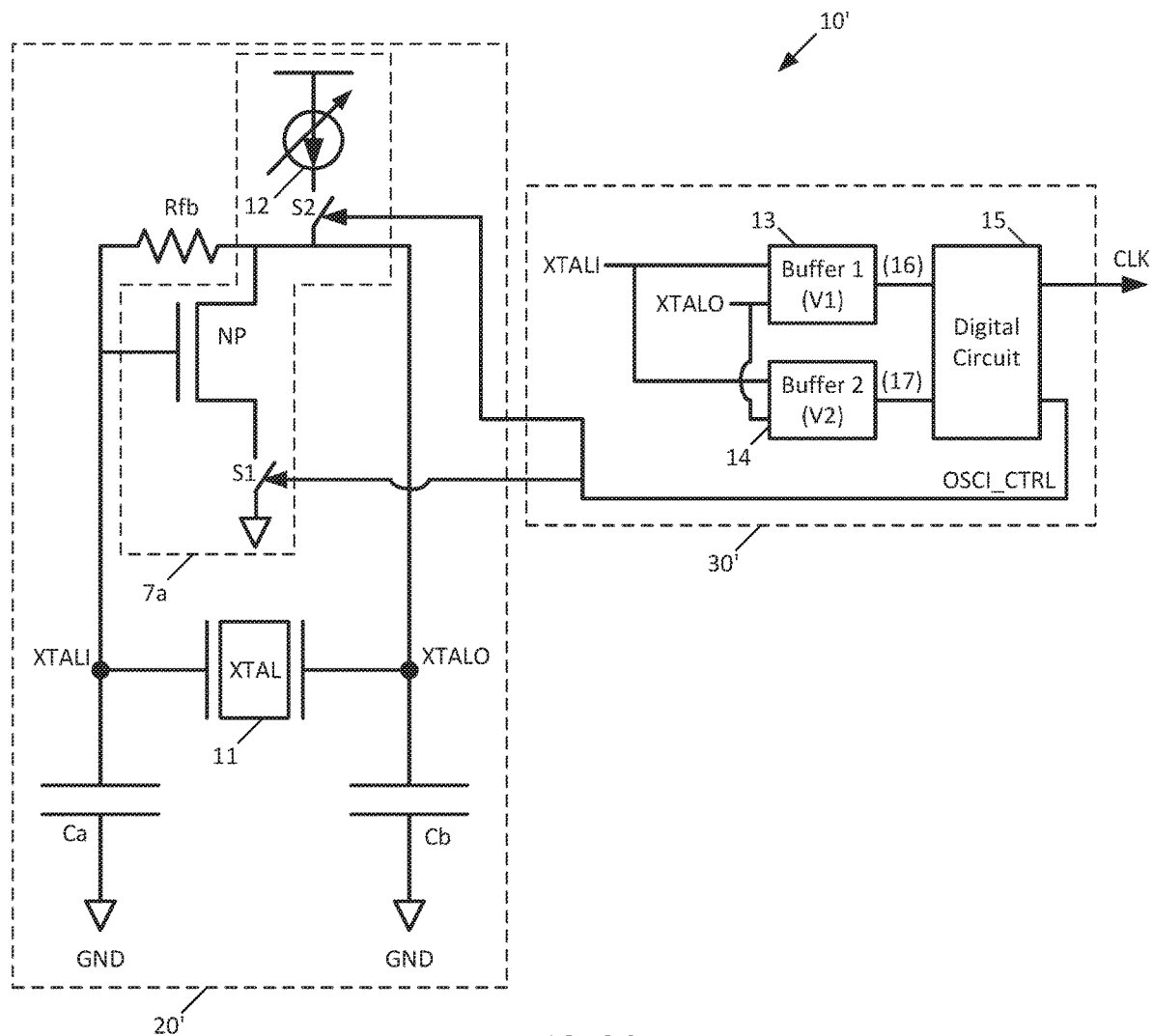
FIG. 2C is a schematic block diagram of an alternative embodiment of the crystal oscillator circuit of FIG. 2B.

Another embodiment of the crystal oscillator circuit 10' is shown in FIG. 2C. In this embodiment, as compared to that of FIG. 2B, the drain of transistor NP is directly electrically connected to XTALO, while the source of transistor NP is directly electrically connected to ground through switch S1. Operation proceeds as described above.

Embodiments of the buffers 13 and 14 that may be used with the crystal oscillator circuits 10 (or 10') of FIGS. 2A-2C will now be described.

Figure 4A:
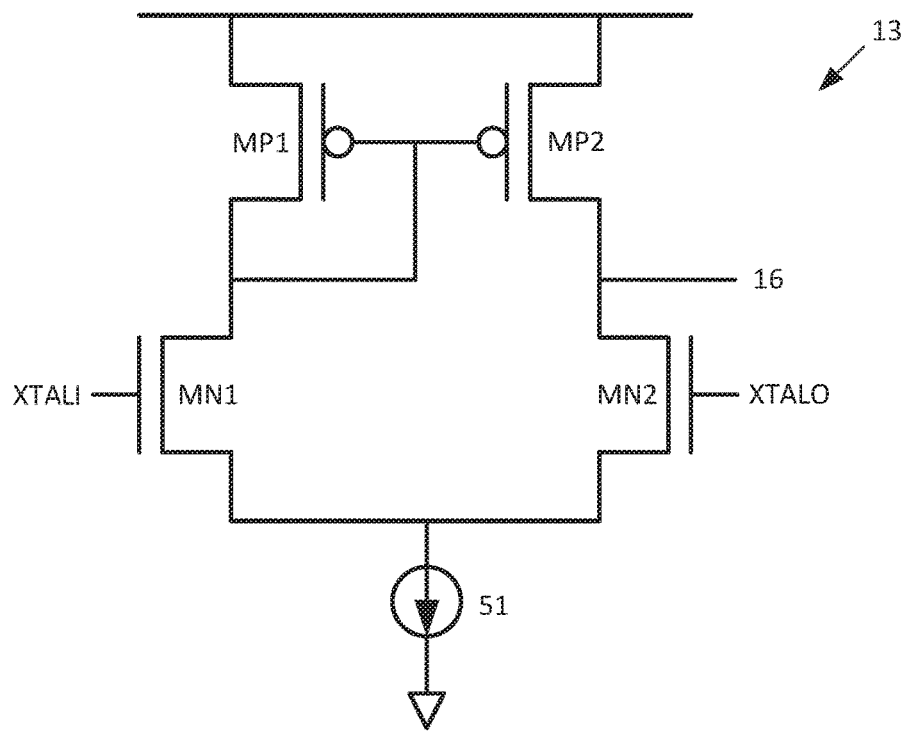
FIG. 4A is a schematic diagram of a possible implementation of the differential buffers of FIGS. 2A-2C.
Figure 4A:
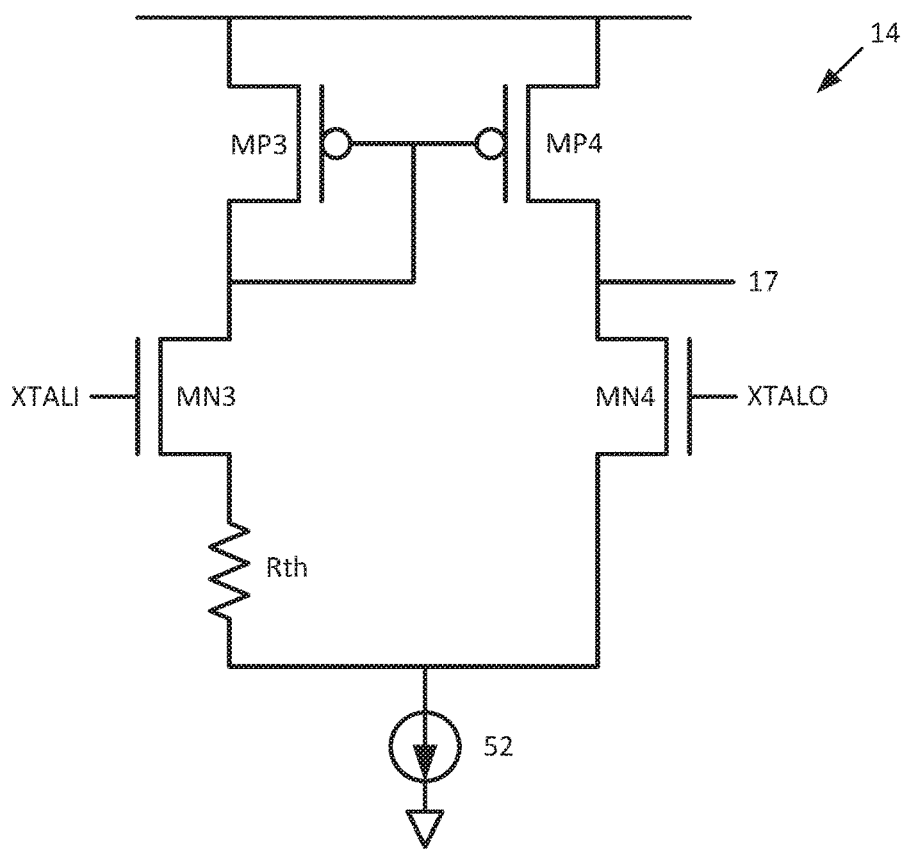

Referring now to FIG. 4A, the buffer 13 is arranged as a typical differential amplifier with a current mirror as an active load. In greater detail, the buffer 13 includes a differential input pair of transistors, NMOS MN1 and NMOS MN2, with the active load being formed from PMOS MP1 and PMOS MP2 in a current mirror arrangement. The gate of MN1 serves as the non-inverting input of the buffer 13 and receives XTALI, while the gate of MN2 serves as the inverting input of buffer 13 and receives XTALO. The drains of MP2 and MN2 produce the output 16. In operation, the output 16 is the difference between XTALI and XTALO, multiplied by a gain. Note that here, the size ratio of MN1/MN2 or MP1/MP2 sets the threshold V1.

The buffer 14 is also arranged as a differential amplifier with a current mirror as an active load. In greater detail, the buffer 14 includes a differential input pair of transistors, NMOS MN3 and NMOS MN4, with the active load being formed from PMOS MP3 and PMOS MP4 in a current mirror arrangement. The gate of MN3 serves as the non-inverting input of the buffer 14 and receives XTALI, while the gate of MN4 serves as the inverting input of buffer 14 and receives XTALO. The drains of MP4 and MN4 produce the output 17. Note that here, the source of MN3 is coupled to the tail current source 52 through the biasing resistor Rth. The resistance value of Rth is adjusted so as to produce the desired threshold V2, however it should be appreciated that the resistor Rth can be eliminated and the size ratio of MN1/MN2 or MP1/MP2 may instead be used to set the threshold V2.

Instead of using the size ratio of MN1/MN2 or MP1/MP2 to set the threshold V1, the buffer 13 may be altered to have the arrangement shown of the buffer 14, and the resistance value of Rth may be used to set the threshold V1.

Figure 4B:
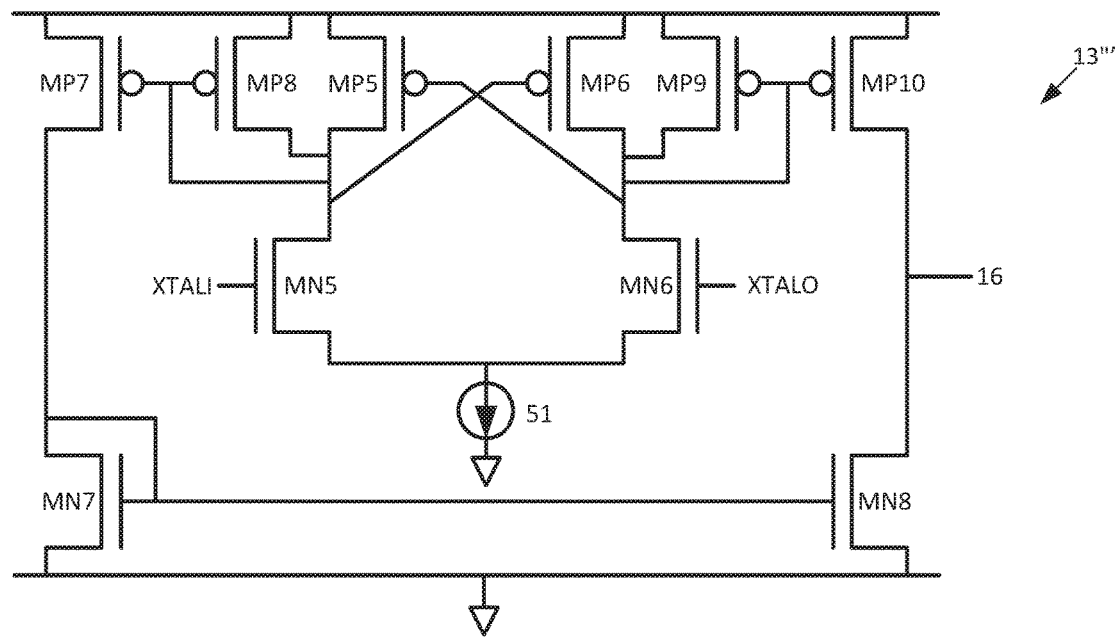
FIG. 4B is a schematic diagram of another possible implementation of the differential buffers of FIGS. 2A-2C.
Figure 4B:
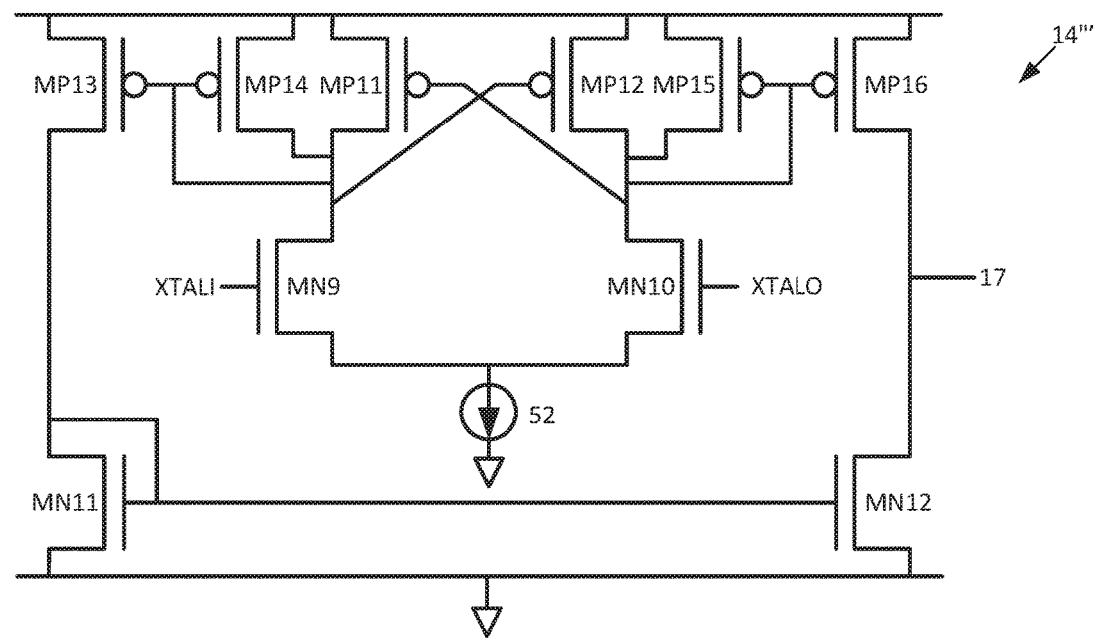

Referring now to FIG. 4B, another embodiment of buffer 13''' and 14''' that may be used with the crystal oscillator circuits 10 (or 10') of FIGS. 2A-2C will now be described.

The buffer 13''' includes a differential input pair comprised of NMOS transistors MN5 and MN6, an active load comprised of PMOS transistors MP5, MP6, MP8, and MP9, and an output stage comprised of PMOS transistors MP7 and MP10, and NMOS transistors MN7 and MN8.

In greater detail, NMOS transistor MN5 has its source coupled to current source 51, its drain coupled to the drains of PMOS transistors MP5 and MP8 and to the gate of PMOS transistor MP6, and its gate biased by XTALI. NMOS transistor MN6 has its source coupled to the current source 51, its drain coupled to the drains of PMOS transistors MP6 and MP9 and to the gate of PMOS transistor MP5, and its gate biased by XTALO.

PMOS transistor MP5 has its source coupled to a supply voltage, its drain coupled to the drains of PMOS transistors MP8 and NMOS transistor MN5, and its gate coupled to the drain of NMOS transistor MN6. PMOS transistor MP6 has its source coupled to the supply voltage, its drain coupled to the drains of PMOS transistors MP6 and MP9, and its gate coupled to the drain of NMOS transistor MN5. PMOS transistor MP8 has its source coupled to the supply voltage, its drain coupled to the drains of PMOS transistor MP5 and NMOS transistor MN5, and its gate coupled to its drain and to the gate of PMOS transistor MP7. PMOS transistor MP9 has its source coupled to the supply voltage, its drain coupled to the drains of PMOS transistor MP6 and NMOS transistor MN6, and its gate coupled to its drain and to the gate of PMOS transistor MP10.

PMOS transistor MP7 has its source coupled to the supply voltage, its drain coupled to the drain of NMOS transistor MN7, and its gate coupled to the gate and drain of PMOS transistor MP8 in a current mirror relationship. PMOS transistor MP10 has its source coupled to the supply voltage, its drain coupled to the drain of NMOS transistor MN8, and its gate coupled to the gate and drain of PMOS transistor MP9 in a current mirror relationship. NMOS transistor MN7 has its drain coupled to the drain of PMOS transistor MP7, its source coupled to ground, and its gate coupled to the gate of NMOS transistor MN8 in a current mirror relationship. NMOS transistor MN8 has its drain coupled to the drain of PMOS transistor MP10, its source coupled to ground, and its gate coupled to the gate of NMOS transistor MN7.

Buffer 13''' operates as a Schmitt trigger with a double ended input, and therefore details of its operation are known by those of skill in the art and need not be given herein for the sake of brevity. The threshold voltage V1 of the buffer 13''' is set by the ratio of the PMOS trigger pairs MP5, MP8 and MP6, MP9.

The buffer 14''' includes a differential input pair comprised of NMOS transistors MN9 and MN10, an active load comprised of PMOS transistors MP11, MP12, MP14, and MP15, and an output stage comprised of PMOS transistors MP13 and MP16, and NMOS transistors MN11 and MN12.

In greater detail, NMOS transistor MN9 has its source coupled to current source 52, its drain coupled to the drains of PMOS transistors MP11 and MP14 and to the gate of PMOS transistor MP12, and its gate biased by XTALI. NMOS transistor MN10 has its source coupled to the current source 52, its drain coupled to the drains of PMOS transistors MP12 and MP15 and to the gate of PMOS transistor MP11, and its gate biased by XTALO.

PMOS transistor MP11 has its source coupled to a supply voltage, its drain coupled to the drains of PMOS transistors MP14 and NMOS transistor MN9, and its gate coupled to the drain of NMOS transistor MN10. PMOS transistor MP12 has its source coupled to the supply voltage, its drain coupled to the drains of PMOS transistors MP12 and MP15, and its gate coupled to the drain of NMOS transistor MN9. PMOS transistor MP14 has its source coupled to the supply voltage, its drain coupled to the drains of PMOS transistor MP11 and NMOS transistor MN9, and its gate coupled to its drain and to the gate of PMOS transistor MP13. PMOS transistor MP15 has its source coupled to the supply voltage, its drain coupled to the drains of PMOS transistor MP12 and NMOS transistor MN10, and its gate coupled to its drain and to the gate of PMOS transistor MP16.

PMOS transistor MP13 has its source coupled to the supply voltage, its drain coupled to the drain of NMOS transistor MN11, and its gate coupled to the gate and drain of PMOS transistor MP14 in a current mirror relationship. PMOS transistor MP16 has its source coupled to the supply voltage, its drain coupled to the drain of NMOS transistor MN12, and its gate coupled to the gate and drain of PMOS transistor MP15 in a current mirror relationship. NMOS transistor MN11 has its drain coupled to the drain of PMOS transistor MP13, its source coupled to ground, and its gate coupled to the gate of NMOS transistor MN12 in a current mirror relationship. NMOS transistor MN12 has its drain coupled to the drain of PMOS transistor MP16, its source coupled to ground, and its gate coupled to the gate of NMOS transistor MN11.

The buffer 14''' operates as a Schmitt trigger with a double ended input, and therefore details of its operation are known by those of skill in the art and need not be given herein for the sake of brevity. The threshold voltage of the buffer 14''' is set by the ratio of the PMOS trigger pairs MP11, MP14 and MP12, MP15.

Figure 2D:
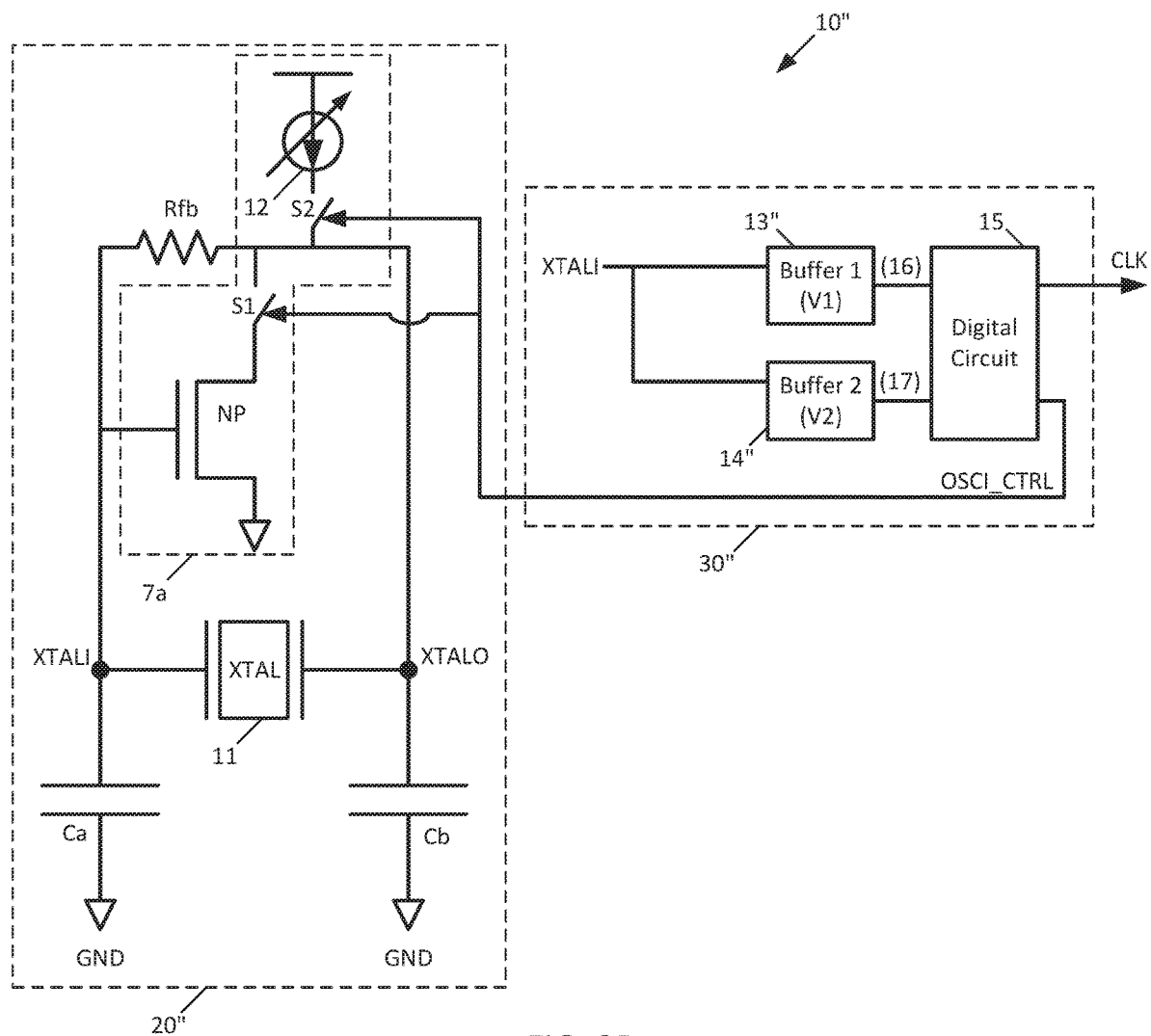
FIG. 2D is a schematic block diagram of an embodiment of a crystal oscillator circuit disclosed herein in which the buffers use single ended sensing.

An alternative embodiment of the crystal oscillator circuit 10'' is shown in FIG. 2D. In this embodiment, the buffers 13'' and 14'' of the monitor circuit 30'' are single ended, and both receive XTALI as input and not XTALO. Thus, here, the buffers 13'' and 14'' do not compare XTALI and XTALO to one another. Instead, the buffers 13'' and 14'' are designed so as to pulse outputs 16 and 17 when XTALI respectively exceeds V1 and V2, but to cease pulsing outputs 16 and 17 when XTALI respectively falls below V1 and V2.

In greater detail, when XTALI is less than the threshold V2, the buffer circuit 14'' indicates as such to the digital circuit 15 by failing to pulse the output 17, which in turn generates the oscillator control signal OSCI_CTRL to cause the current source 12 to switch on, resulting in the XTALI beginning to increase. When XTALI rises sufficiently to exceed the threshold V2, then the buffer circuit 14'' indicates as such to the digital circuit 15 by beginning to pulse the output 17, which in turn generates the oscillator control signal OSCI_CTRL to cause the current source 12 to switch off. This is repeated, and provided that XTALI exceeds the threshold V1 (which is less than the threshold V2), serves to cause the digital circuit 15 to generate the clock signal CLK for output.

Figure 2E:
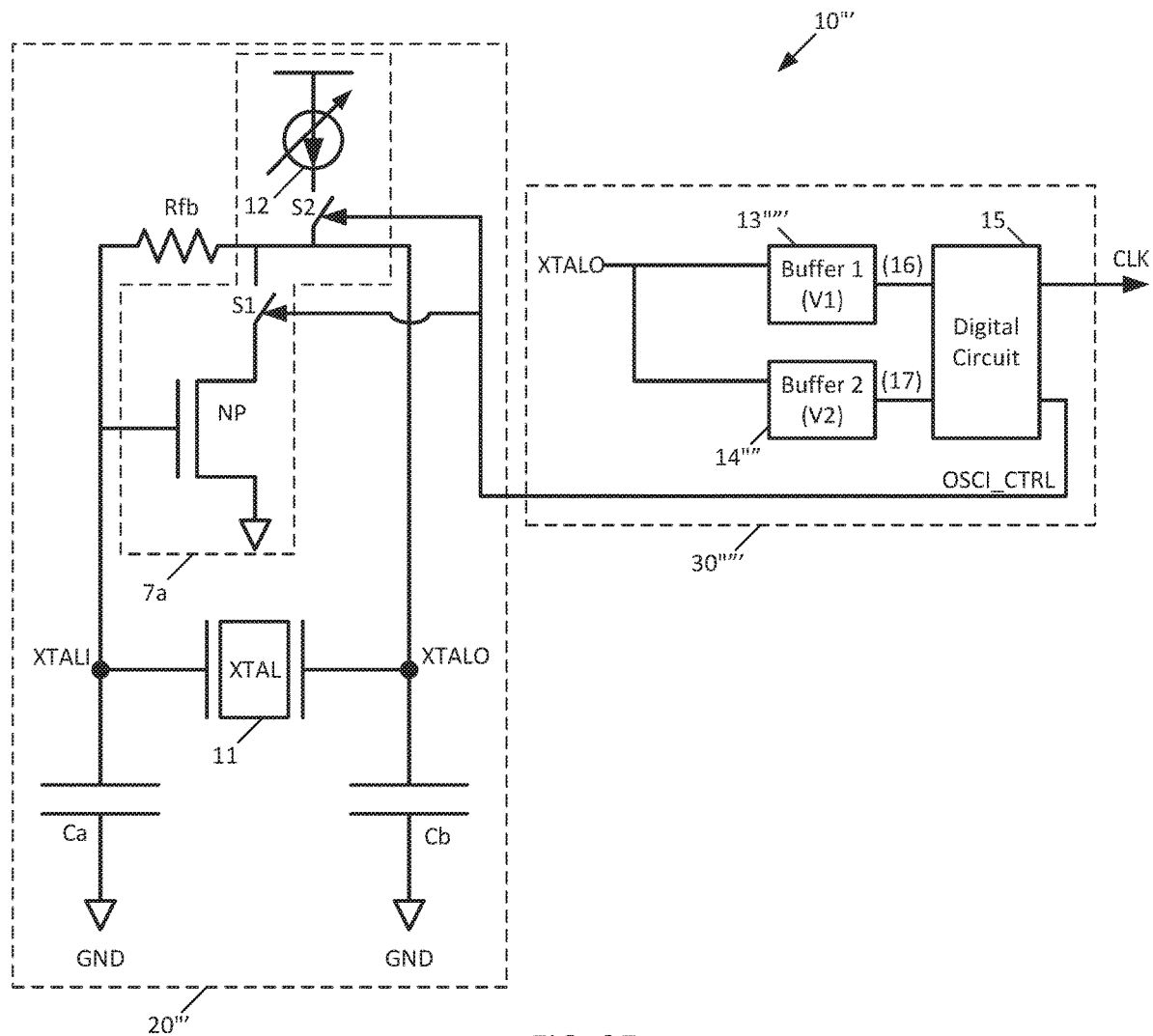
FIG. 2E is a schematic block diagram of an alternative embodiment of a crystal oscillator circuit disclosed herein in which the buffers use single ended sensing.

It should be understood that XTALO may be used instead of XTALI in other variants of the monitor circuit 30''. Such an embodiment is shown in FIG. 2E, where the buffers 13'''' and 14'''' of the crystal oscillator circuit 10''' both receive XTALO as input and not XTALI. Similarly, the buffers 13'''' and 14'''' do not compare XTALI and XTALO to one another, and are instead designed so as to pulse outputs 16 and 17 when XTALO respectively exceeds V1 and V2, but to cease pulsing outputs 16 and 17 when XTALO respectively falls below V1 and V2.

When XTALO is less than the threshold V2, the buffer circuit 14'''' indicates as such to the digital circuit 15 by failing to pulse the output 17, which in turn generates the oscillator control signal OSCI_CTRL to cause the current source 12 to switch on, resulting in the XTALO beginning to increase. When XTALO rises sufficiently to exceed the threshold V2, then the buffer circuit 14'''' indicates as such to the digital circuit 15 by beginning to pulse the output 17, which in turn generates the oscillator control signal OSCI_CTRL to cause the current source 12 to switch off. This is repeated, and provided that XTALO exceeds the threshold V1 (which is less than the threshold V2), serves to cause the digital circuit 15 to generate the clock signal CLK for output.

An embodiment of the buffers 13' and 14' that may be used with the crystal oscillator circuits 10'' of FIG. 2D will now be described.

Figure 4C:
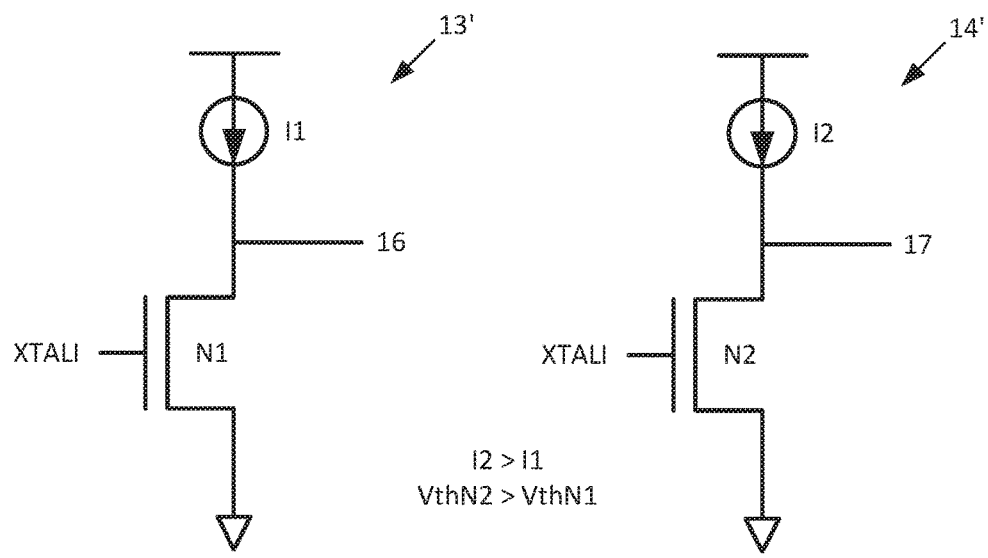
FIG. 4C is a schematic diagram of a possible implementation of the single ended buffers of FIG. 2D.

Referring now to FIG. 4C, the buffer 13' is arranged as a typical common source amplifier, and includes NMOS transistor N1 having a grounded source, a gate receiving XTALI, and a drain coupled to current source I1 and providing output 16. The buffer 14' is also arranged as a typical common source amplifier, and includes NMOS transistor N2 having a grounded source, a gate receiving XTALI, and a drain coupled to current source I2 and providing output 17. The current provided by I2 is greater than that provided by I1, with the result being that the gate to source voltage required to turn on the buffer 14' will be higher than the gate to source voltage required to turn on the buffer 13'. Through proper selection of transistors N1 and N2, as well as the currents provided by I1 and I2, the thresholds V1 and V2 can be set as desired.

Another embodiment of the buffers 13'' and 14'' that may be used with the crystal oscillator circuits 10'' of FIG. 2D will now be described.

Figure 4D:
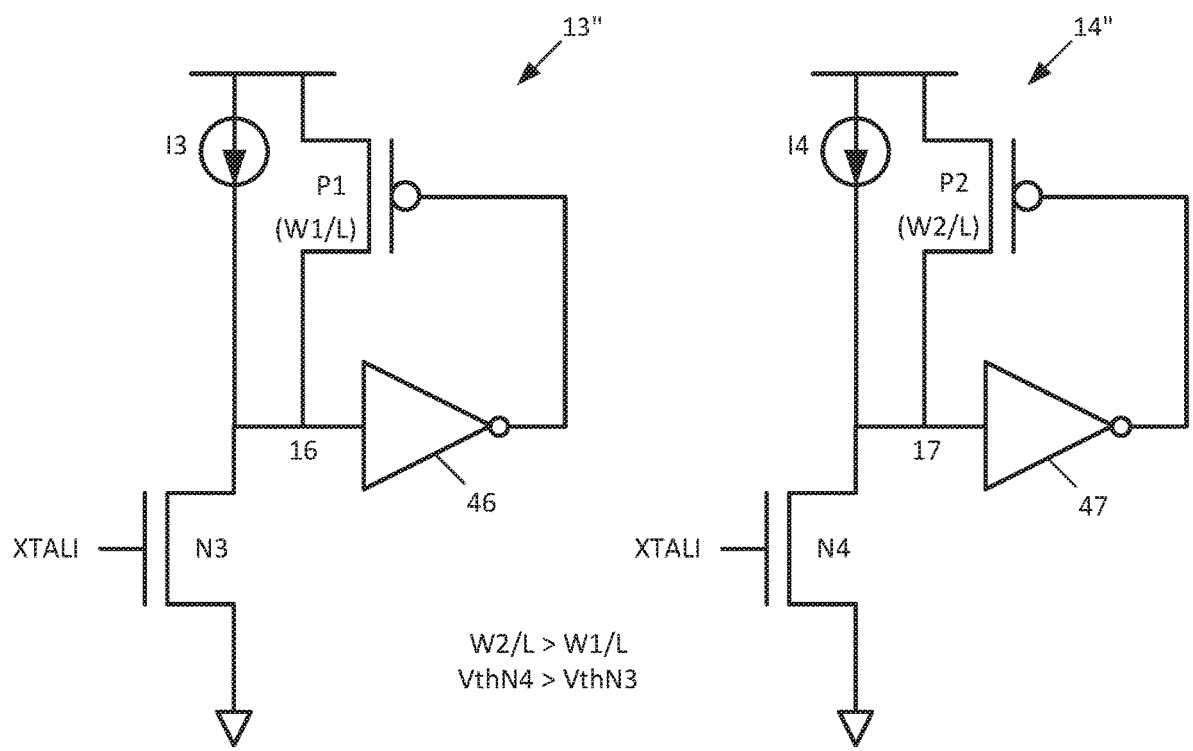
FIG. 4D is a schematic diagram of another possible implementation of the single ended buffers of FIG. 2D.

Referring now to FIG. 4D, the buffer 13'' is arranged as a common source amplifier with hysteresis used to set the threshold V1. In greater detail, the buffer 13'' includes NMOS transistor N3 having a source coupled to ground, a gate receiving XTALI, and a drain coupled to current source I3 and providing output 16. An inverter 46 has its input coupled to the output 16. PMOS transistor P1 has its source coupled to the supply voltage, its drain coupled to the output 16, and its gate coupled to receive the output of inverter 46. Hysteresis is provided by the inverter 46 and transistor P1, which together with proper selection of the size of N3, serves to set the threshold V1.

Referring still to FIG. 4D, the buffer 14'' is arranged as a common source amplifier with hysteresis used to set the threshold V2. In greater detail, the buffer 14'' includes NMOS transistor N4 having a source coupled to ground, a gate receiving XTALI, and a drain coupled to current source I4 and providing output 17. An inverter 47 has its input coupled to the output 17. PMOS transistor P2 has its source coupled to the supply voltage, its drain coupled to the output 17, and its gate coupled to receive the output of inverter 47. Hysteresis is provided by the inverter 47 and transistor P2, which together with proper selection of the size of N4, serves to set the threshold V2.

Another embodiment of the buffers 13'''' and 14'''' that may be used with the crystal oscillator circuits 10'' of FIG. 2D will now be described.

Figure 4E:
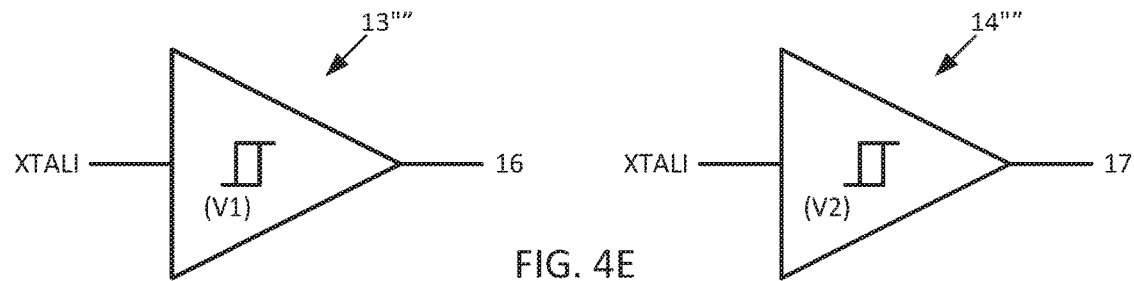
FIG. 4E is a schematic diagram of a further possible implementation of the single ended buffers of FIG. 2D.

Referring now to FIG. 4E, the buffer 13'''' is arranged as a Schmitt trigger with a single ended input, and the buffer 14''' is also arranged as a Schmitt trigger with a single ended input. For this embodiment, the first and second threshold voltages V1 and V2 are instead first and second threshold voltage ranges, meaning that V1 has upper and lower limits, and that V2 has upper and lower limits. In such an instance, V1 is exceeded if the upper limit of V1 is exceeded by a voltage in question, and V1 is fallen below if the voltage in question falls below the lower limit of V1. Likewise, in such an instance, V2 is exceeded if the upper limit of V2 is exceeded by the voltage in question, and V2 is fallen below if the voltage in question falls below the lower limit of V2. Otherwise, operation of the crystal oscillator circuit 10'' proceeds as described above.

When XTALI is less than the threshold range V2, the buffer circuit 14'''' indicates as such to the digital circuit 15 by failing to pulse the output 17, which in turn generates the oscillator control signal OSCI_CTRL to cause the current source 12 to switch on, resulting in the XTALI beginning to increase. When XTALI rises sufficiently to exceed the threshold range V2, then the buffer circuit 14'''' indicates as such to the digital circuit 15 by beginning to pulse the output 17, which in turn generates the oscillator control signal OSCI_CTRL to cause the current source 12 to switch off. This is repeated, and provided that XTALI exceeds the threshold range V1 (which is less than the threshold range V2), serves to cause the digital circuit 15 to generate the clock signal CLK for output.

Figure 5:
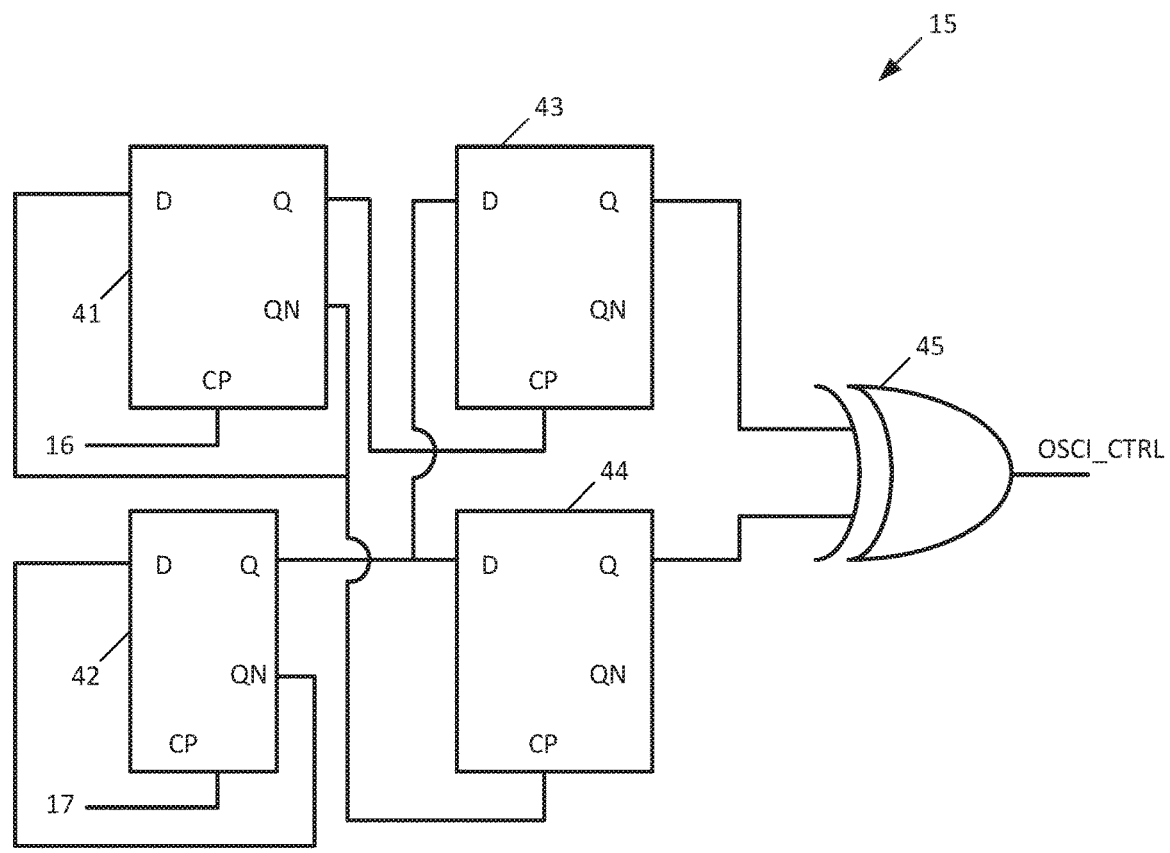
FIG. 5 is a schematic block diagram of a possible implementation the digital circuit of FIGS. 2A-2E.

An example digital circuit 15 such as may be used with the embodiments shown in FIGS. 2A-2D is now shown in FIG. 5. The digital circuit 15 includes flip flops 41-44.

The flip flop 41 is clocked by the output 16 and has its D input coupled to its QN output. The flip flop 42 is clocked by the output 16 and has its D input coupled to its QN output. The flip flop 43 is clocked by the Q output of the flip flop 41 and has its D input coupled to the Q output of the flip flop 42. The flip flop 44 is clocked by the QN output of the flip flop 41 and has its D input coupled to the Q output of the flip flop 42. Exclusive OR gate 45 has its inputs coupled to the Q outputs of the flip flops 43 and 44, and generates the OSCI_CTRL signal at its output.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A crystal oscillator circuit, comprising:
a crystal producing first and second oscillation signals that are approximately opposite in phase; and
a monitor circuit configured to switch off power to a crystal oscillator core of the crystal in response to a difference between a voltage of the first oscillation signal and a voltage of the second oscillation signal exceeding an upper threshold range, and to switch on power to the crystal oscillator core in response to the difference between the voltage of the first oscillation signal and the voltage of the second oscillation signal falling below the upper threshold range.

2. The crystal oscillator circuit of claim 1, wherein the monitor circuit comprises a first comparator configured to indicate whether the difference between the voltage of the first oscillation signal and the voltage of the second oscillation signal exceeds the upper threshold range.

3. The crystal oscillator circuit of claim 2, wherein the monitor circuit further comprises a second comparator configured to indicate whether the difference between the voltage of the first oscillation signal and the voltage of the second oscillation signal exceeds a lower threshold range that is less than the upper threshold range.

4. The crystal oscillator circuit of claim 3, wherein the monitor circuit outputs a clock signal as a function of the first and second oscillation signals, in response to the difference between the voltage of the first oscillation signal and the voltage of the second oscillation signal exceeding the lower threshold range.

5. The crystal oscillator circuit of claim 1, wherein the crystal respectively produces the first and second oscillation signals at first and second terminals; and further comprising:
a transistor having a first conduction terminal connected to the second terminal of the crystal, a second conduction terminal connected to a reference voltage, and a control terminal connected to the first terminal of the crystal;
a current source connected to the first conduction terminal of the transistor;
a feedback resistor connected between the first conduction terminal of the transistor and the control terminal of the transistor;
a first capacitor connected between the first terminal of the crystal and the reference voltage; and
a second capacitor connected between the second terminal of the crystal and the reference voltage.

6. The crystal oscillator circuit of claim 5, wherein the monitor circuit generates a control signal that serves to turn the current source off in response to the difference between the voltage of the first oscillation signal and the voltage of the second oscillation signal exceeding the upper threshold range and that serves to turn the current source on in response to the difference between the voltage of the first oscillation signal and the voltage of the second oscillation signal falling below the upper threshold range.

7. The crystal oscillator circuit of claim 1, wherein the monitor circuit only compares the voltage of the first oscillation signal to the voltage of the second oscillation signal, does not compare the voltage of the first oscillation signal to a reference voltage, and does not compare the voltage of the second oscillation signal to the reference voltage.

8. A method of generating a clock signal, the method comprising steps of:
a) switching on a crystal oscillator core to produce first and second oscillation signals that are approximately opposite in phase;
b) when a difference between a voltage of the first oscillation signal and a voltage of the second oscillation signal exceeds an upper threshold range, switching off the crystal oscillator core;
c) when the difference between the voltage of the first oscillation signal and the voltage of the second oscillation signal falls below the upper threshold range, switching on the crystal oscillator core; and
d) repeating steps b) and c) to produce the clock signal.

9. The method of claim 8, further comprising outputting the clock signal from a buffer that determines the difference between the voltage of the first oscillation signal and the voltage of the second oscillation signal.

10. A crystal oscillator circuit, comprising:
a crystal having a first terminal and a second terminal, wherein first and second oscillation signals are respectively present at the first and second terminals, the first and second oscillation signals being approximately opposite in phase;
an inverter having an input coupled to the first terminal of the crystal and an output coupled to the second terminal of the crystal, wherein the inverter provides power to the crystal when the inverter is on; and
a monitor circuit configured to compare the first and second oscillation signals, and to cause the inverter to modulate the power to the crystal so as to maintain a difference between voltages of the first and second oscillation signals in a desired range.

11. The crystal oscillator circuit of claim 10, wherein the monitor circuit causes the inverter to modulate the power to the crystal by:
turning the inverter on when a difference between the voltage of the first oscillation signal and the voltage of the second oscillation signal exceeds an upper threshold range; and
turning the inverter off when the difference between the voltage of the first oscillation signal and the voltage of the second oscillation signal falls below the upper threshold range.

12. The crystal oscillator circuit of claim 11, wherein the monitor circuit is configured to output a clock signal as a function of the first and second oscillation signals.

13. The crystal oscillator circuit of claim 10, further comprising a feedback resistor coupled between the first and second terminals of the crystal, a first capacitor coupled between the first terminal of the crystal and ground, and a second capacitor coupled between the second terminal of the crystal and ground.

14. A crystal oscillator circuit, comprising:
a crystal producing a first oscillation signal; and
a monitor circuit configured to switch off power to a crystal oscillator core of the crystal in response to a voltage of the first oscillation signal exceeding an upper threshold range without comparison of the voltage of the first oscillation signal to a reference voltage generated externally to the monitor circuit, and to switch on power to the crystal oscillator core in response to the voltage of the first oscillation signal falling below the upper threshold range without comparison of the voltage of the first oscillation signal to a reference voltage generated externally to the monitor circuit;
wherein the monitor circuit comprises a first common source amplifier comprising a first NMOS transistor having a source coupled to ground, a drain coupled to a first reference current and providing output, and a gate coupled to receive the first oscillation signal.

15. The crystal oscillator circuit of claim 14, wherein the monitor circuit further comprises a second common source amplifier comprising a second NMOS transistor having a source coupled to ground, a drain coupled to a second reference current greater than the first reference current and providing output, and a gate coupled to receive the first oscillation signal.

16. A crystal oscillator circuit, comprising:
a crystal producing a first oscillation signal; and
a monitor circuit configured to switch off power to a crystal oscillator core of the crystal in response to a voltage of the first oscillation signal exceeding an upper threshold range without comparison of the voltage of the first oscillation signal to a reference voltage generated externally to the monitor circuit, and to switch on power to the crystal oscillator core in response to the voltage of the first oscillation signal falling below the upper threshold range without comparison of the voltage of the first oscillation signal to a reference voltage generated externally to the monitor circuit;
wherein the monitor circuit comprises:
a first NMOS transistor having a source coupled to ground, a drain coupled to a first reference current and providing output, and a gate coupled to receive the first oscillation signal;
a first PMOS transistor having a source coupled to a source voltage, a drain coupled to the drain of the first NMOS transistor, and a gate; and
a first inverter having an input coupled to the drain of the first NMOS transistor and an output coupled to the drain of the first PMOS transistor.

17. The crystal oscillator circuit of claim 16, wherein the monitor circuit comprises:
a second NMOS transistor having a source coupled to ground, a drain coupled to a second reference current and providing output, and a gate coupled to receive the first oscillation signal;
a second PMOS transistor having a source coupled to a source voltage, a drain coupled to the drain of the second NMOS transistor, and a gate; and
a second inverter having an input coupled to the drain of the second NMOS transistor and an output coupled to the drain of the second PMOS transistor;
wherein a size of the first PMOS transistor is less than a size of the second PMOS transistor.

18. A crystal oscillator circuit, comprising:
a crystal producing a first oscillation signal; and
a monitor circuit configured to switch off power to a crystal oscillator core of the crystal in response to a voltage of the first oscillation signal exceeding an upper threshold range without comparison of the voltage of the first oscillation signal to a reference voltage generated externally to the monitor circuit, and to switch on power to the crystal oscillator core in response to the voltage of the first oscillation signal falling below the upper threshold range without comparison of the voltage of the first oscillation signal to a reference voltage generated externally to the monitor circuit;
wherein the crystal produces the first oscillation signal at a first terminal; and further comprising:
a transistor having a first conduction terminal connected to a second terminal of the crystal, a second conduction terminal connected to a reference voltage, and a control terminal connected to the first terminal of the crystal;
a current source connected to the first conduction terminal of the transistor;
a feedback resistor connected between the first conduction terminal of the transistor and the control terminal of the transistor;
a first capacitor connected between the first terminal of the crystal and the reference voltage; and
a second capacitor connected between the second terminal of the crystal and the reference voltage.

19. A method of generating a clock signal, the method comprising steps of:
a) switching on a crystal oscillator core to produce a first oscillation signal;
b) determining when a voltage of the first oscillation signal exceeds an upper threshold range without comparing the first oscillation signal to an externally generated reference voltage, and when the voltage of the first oscillation signal exceeds the upper threshold range, switching off the crystal oscillator core;

c) determining when the voltage of the first oscillation signal falls below the upper threshold range without comparing the first oscillation signal to an externally generated reference voltage, and when the voltage of the first oscillation signal falls below the upper threshold range, switching on the crystal oscillator core;

d) repeating steps b) and c) to produce the clock signal; and e) outputting the clock signal from a common source amplifier that receives the first oscillation signal as input and wherein the common source amplifier has hysteresis setting the upper threshold range.

20. A crystal oscillator circuit, comprising:

a crystal producing first and second oscillation signals that are approximately opposite in phase; and a monitor circuit configured to selectively switch power to a crystal oscillator core of the crystal on and off based upon a difference between a voltage of the first oscillation signal and a voltage of the second oscillation signal.

21. The crystal oscillator circuit of claim 20, wherein the monitor circuit comprises:

a first comparator configured to indicate whether the difference between the voltage of the first oscillation signal and the voltage of the second oscillation signal exceeds an upper threshold range;

a second comparator configured to indicate whether a difference between the voltage of the first oscillation signal and the voltage of the second oscillation signal exceeds a lower threshold range less than the upper threshold range;

a digital circuit configured to:
switch off power to the crystal oscillator core if the difference between the voltage of the first oscillation signal and the voltage of the second oscillation signal exceeds the upper threshold range;
switch on power to the crystal oscillator core if the difference between the voltage of the first oscillation signal and the voltage of the second oscillation signal falls below the upper threshold range; and
output a clock signal based upon the first and second oscillation signals if the difference between the voltage of the first oscillation signal and the voltage of the second oscillation signal exceeds the lower threshold range.

22. The crystal oscillator circuit of claim 21, wherein the crystal respectively produces the first and second oscillation signals at first and second terminals;

further comprising:
a transistor having a first conduction terminal connected to the second terminal of the crystal a second conduction terminal connected to a reference voltage, and a control terminal connected to the first terminal of the crystal;
a current source connected to the first conduction terminal of the transistor;
a feedback resistor connected between the first conduction terminal of the transistor and the control terminal of the transistor;
a first capacitor connected between the first terminal of the crystal and the reference voltage; and
a second capacitor connected between the second terminal of the crystal and the reference voltage;

wherein the digital circuit switches power off to the crystal oscillator core by generating a control signal that serves to turn the current source off in response to the difference between the voltage of the first oscillation signal and the voltage of the second oscillation signal exceeding the upper threshold range; and wherein the digital circuit switches power on to the crystal oscillator core by generating a control signal that serves to turn the current source on in response to the difference between the voltage of the first oscillation signal and the voltage of the second oscillation signal falling below the upper threshold range.

23. A method, comprising:

a) switching on a crystal oscillator core to produce first and second oscillation signals that are approximately opposite in phase;

b) when an amplitude envelope formed by the first and second oscillation signals exceeds a threshold amplitude envelope, switching off the crystal oscillator core;

c) when the amplitude envelope falls inside of the threshold amplitude envelope, switching on the crystal oscillator core;

d) repeating steps b) and c) to produce a clock signal; and e) outputting the clock signal from a buffer that determines the amplitude envelope.

* * * * *